United States Patent [19]

Roth et al.

[11] Patent Number: 5,721,522

[45] Date of Patent: Feb. 24, 1998

[54] NMR SPECTROMETER WITH SUPERCONDUCTING MAGNET COIL

[75] Inventors: Gerhard Roth, Rheinstetten; Arne Kasten, Karlsruhe, both of Germany

[73] Assignee: Bruker Analytische Messtechnik GmbH, Rheinstetten, Germany

[21] Appl. No.: 609,802

[22] Filed: Mar. 1, 1996

[30] Foreign Application Priority Data

Mar. 15, 1995 [DE] Germany .................. 195 09 314.3

[51] Int. Cl.[6] .................................................. H01F 1/00
[52] U.S. Cl. ........................... 335/216; 335/299; 324/318
[58] Field of Search ............................... 335/216, 299, 335/306; 324/318, 319, 320, 321, 322

[56] References Cited

U.S. PATENT DOCUMENTS

| 4,878,352 | 11/1989 | Weber et al. | |
|---|---|---|---|
| 5,220,800 | 6/1993 | Müller et al. | |
| 5,280,247 | 1/1994 | DeMeester et al. | 335/216 |
| 5,304,972 | 4/1994 | Sato | 335/216 |

FOREIGN PATENT DOCUMENTS 2282227  3/1995  United Kingdom .

*Primary Examiner*—Lincoln Donovan
*Attorney, Agent, or Firm*—Paul J. Vincent

[57] ABSTRACT

In a superconducting magnet coil configuration, in particular for a high resolution analytical nuclear resonance (NMR) spectrometer, with a cryostat having extremely low heat losses (low loss), comprising at least one essentially cylindrical container (1) with a vertical cylinder axis (k), with a vertical cylindrical room temperature bore (3) and with at least one inner tank (4) for a cryogenic liquid in thermal contact with a superconducting magnet coil (2) enclosing the room temperature bore (3), for generating a vertically directed, extremely homogeneous and stable magnetic field of high field strength inside a measuring volume of the room temperature bore (3), the vertical axes (r) of the room temperature bore (3) and of the superconducting magnet coil (2) run parallel to and at a distance from the vertical cylinder axis (k) of at least one of the cylindrical cryostat containers (1). In this way, access to the room temperature bore (3) is considerably simplified.

15 Claims, 5 Drawing Sheets

NMR SPECTROMETER WITH SUPERCONDUCTING MAGNET COIL

BACKGROUND OF THE INVENTION

The invention concerns a superconducting magnet coil configuration, in particular for a high resolution analytical nuclear resonance (NMR) spectrometer, with a cryostat having extremely low heat losses (low loss), comprising at least one essentially cylindrical container with a vertical cylinder axis, with a vertical cylindrical room temperature bore and with at least one inner tank for a cryogenic liquid in thermal contact with a superconducting magnet coil enclosing the room temperature bore, for generating a vertically directed, extremely homogeneous and stable magnetic field of high field strength inside a measuring volume of the room temperature bore.

Such a superconducting magnet configuration is for example known from DE 40 39 365 A1.

Magnet coils of high resolution NMR spectrometers have to fulfil extreme requirements with respect to homogeneity and stability of the magnetic field inside the measuring volume, which are described in detail in the above mentioned laid open publication. In order to increase the signal strength and the spectrometer resolution it is, above all, desirable to further increase the magnetic field strength, however, without thereby affecting the magnetic field homogeneity and stability. The highest present magnetic field strength suitable for NMR is 17.6 Tesla (750 MHz proton frequency).

The first measurements at this field strength were performed with a magnet system embodying a number of features described in the above cited laid open publication (BRUKER AVANCE DMX 750). Apart from the excellent homogeneity and stability, above all, extremely low coolant losses are also very important. As discussed in the above cited laid open publication, these properties partly depend on each other.

For identical technology, higher field strengths obviously require larger magnet coils and therefore also larger cryostats. Moreover, in the magnet coil configuration cited above, the coil is housed inside a tank with supercooled helium below a storage tank having helium at 4.2 K. Both are surrounded by radiation shields and by a nitrogen tank. This leads to a cylindrical cryostat of large diameter and substantial height. The so-called probehead with the NMR measuring electronics is inserted into the room temperature bore of the cryostat from below. For this purpose, sufficient ground clearance is required. Generally, the sample is lowered against a gas stream from the top down to the magnetic field centre. If it has to be changed manually, it is necessary to climb onto a frame. The radial distance from the outer cryostat hull to the room temperature bore is comparable to the length of an operator's arm, impeding a probehead change or adjustments at the bottom as well as the sample change on the top.

It is therefore the purpose of the invention to improve a superconducting magnet configuration of the above mentioned kind in that access to the room temperature bore is simplified.

SUMMARY OF THE INVENTION

This purpose is achieved in a surprisingly simple manner in that the vertical axes of the room temperature bore and of the superconducting magnet coil run parallel to but at a distance from the vertical cylinder axis of at least one of the cylindrical containers of the cryostat.

Due to the eccentric configuration of the room temperature bore and thereby necessarily of the enclosing magnet coil, the distance of the bore to the still essentially cylindrical outer cryostat hull can be reduced on one side only and thereby a better access to both ends of the bore is achieved. In other angular ranges of the circumference, the distance is actually increased, but no access is required there.

In a particularly simple embodiment of the magnet configuration according to the invention, the cryostat comprises a cylindrical outer hull through which the vertical cylindrical room temperature bore runs at a horizontal distance parallel to the container axis along its complete length from the top to the bottom.

However, an embodiment is particularly preferred where the cryostat comprises a cylindrical outer hull which, in a region above the magnet coil, comprises a recess running in a horizontal direction up to at least the container sided inner edge of the room temperature bore, and which runs vertically up to the upper end of the cryostat. This has the advantage of a further improved one-sided access to the upper end of the room temperature bore, making the sample changing procedure considerably easier.

In an advantageous further development of this embodiment, a recess is provided having a segment-shaped horizontal cross-section with a straight horizontal edge, wherein the horizontal edge preferably touches the container sided inner edge of the room temperature bore or runs even further in the direction towards the container centre. Such a recess can be formed relatively easily in a cylindrical container.

As an alternative, in a further development of this embodiment, the recess can be sector-shaped in horizontal cross-section and can run in a predetermined angular range about an axis parallel to the room temperature bore axis along a straight line defining the, with respect to the container, inner edge of the room temperature bore. In this way, the recess is deliberately limited to the spatial region immediately around the room temperature bore, so that the cryostat keeps an optimum remaining volume, whereby the upper end of the room temperature bore can be reached particularly well. The predetermined angular range is generally about 90° or slightly less.

An alternative embodiment of the magnet configuration according to the invention is also advantageous which is distinguished by a cryostat comprising two cylindrical containers, the first of which contains the magnet coil and coaxially the room temperature bore, whereas the other container is at least partly arranged on top of the first container in such a way that both vertical cylinder axes of the containers run parallel and at a distance, whereby cryogenic liquids of the same kind contained in both containers are communicating. In such an eccentric two-container configuration, the lower container serves for housing the magnet coil, whereas the upper container essentially contains the cryogenic liquid store required for the long-term use of the spectrometer. Both containers are cylindrical and can therefore technically be manufactured particularly easily.

In an advantageous improvement of this embodiment, both containers are arranged side by side and comprise a horizontal connecting channel. Cryogenic liquid can flow via this channel from the upper storage container to the magnet coil container located further below.

Alternatively, in a preferred improvement of this embodiment, both containers are configured such that, seen from the top, their visible cross-sections overlap and comprise a vertical connecting channel. Such a configuration is particularly space-saving and compact while making use of the advantages of cylindrical containers which are particularly simple to manufacture.

In a particularly preferred embodiment of the magnet configuration according to the invention, the cryostat comprises a first chamber, in which the magnet coil is located surrounded by supercooled liquid helium at a temperature of less than 4.2. K, the cryostat comprising a further chamber with liquid helium essentially at atmospheric pressure with a temperature of about 4.2. K, with the first chamber being connected to the further chamber such that the supercooled liquid helium located in the first chamber is also essentially at atmospheric pressure. The advantages of such a two-chamber configuration are described in detail in the above-mentioned laid open publication.

Preferably, the first chamber is at least partly located below the further chamber, so that the liquid helium of the further chamber can flow into the first chamber, for example via a channel across a barrier between both chambers, because of gravity.

An embodiment of the magnet configuration according to the invention is also particularly preferred where the magnet coil is suspended symmetrically inside the cryostat. In this way it is ensured that during steady cooling down no one-sided strains occur and therefore no tilts of the magnet coil which would appreciably disturb the magnetic field homogeneity for high resolution spectroscopy. The suspension points of the magnet coil are usually located in the filling or evaporating towers of the cryostat described below.

In a further preferred embodiment of the invention, the cryostat comprises at its top at least two towers arranged on a circular ring about the room temperature bore axis, through which liquid helium can be filled in and/or evaporating helium can be guided to the outside. This has the conventional advantage that, for reasonable constructional height of the cylindrical main body of the cryostat, coolant losses can be optimised by the distance between cryogenic and room temperature which is lengthened by the towers.

Particularly preferred are embodiments with two towers whose line of connection crosses the room temperature bore axis and which have the same distance from this axis, or with three towers, respectively, which are arranged about the axis in the form of an at least isosceles, preferably equilateral triangle. These symmetrical configurations per se which largely avoid torques of the coil suspension are also known from conventional cryostats. However, there the room temperature bore axis coincides with the cryostat cylinder axis. In the cryostat according to the invention these configurations are responsible for the fact that, in spite of eccentric arrangement of the coil, it can be suspended largely symmetrically and the coolant can evaporate symmetrically through the towers.

Further advantages of the invention result from the description and the accompanying drawing. The above mentioned features and those to be further described below in accordance with the invention can be utilised individually or collectively in arbitrary combination. The embodiments shown and described are not to be considered as exhaustive enumeration, rather have exemplary character only.

The invention is represented in the drawing and is described and explained in more detail by means of specific embodiments. It is shown in:

BRIEF DESCRIPTION OF THE DRAWING

FIG. 1b a schematic vertical cross-section in the direction A—A across the embodiment of FIG. 1a;

FIG. 2b a schematic vertical cross-section in the direction B—B across the embodiment of FIG. 2a;

FIG. 3b a schematic vertical cross-section in the direction C—C across the embodiment of FIG. 3a;

FIG. 4b a schematic vertical cross-section in the direction D—D across the embodiment of FIG. 4a;

FIG. 5b a schematic vertical cross-section in the direction E—E across the embodiment of FIG. 5a.

DESCRIPTION OF THE PREFERRED EMBODIMENT

Figure 1A:
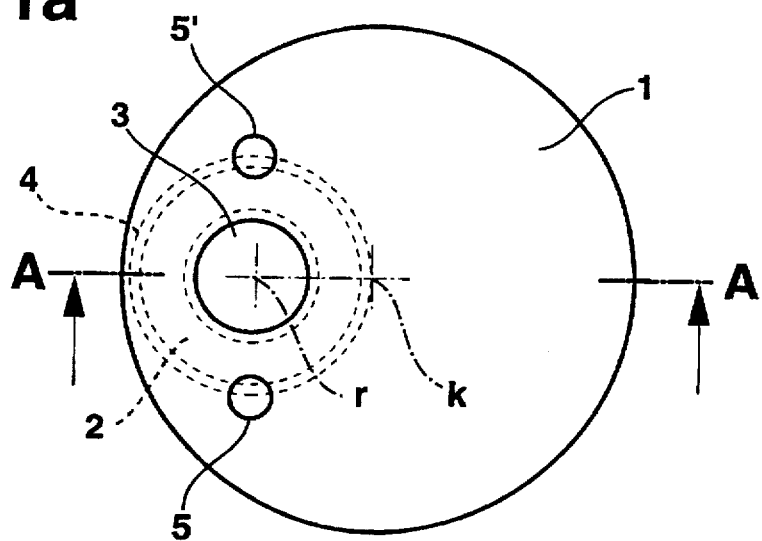
FIG. 1a a schematic cross-section in a horizontal plane across a first embodiment of the coil configuration according to the invention.

FIG. 1a schematically shows a horizontal cross-section through a superconducting magnet configuration for a high resolution analytical nuclear spin resonance (NMR) spectrometer which is housed in a cryostat with a cylindrical container 1 as outer hull. The cryostat is a so-called "low loss" cryostat with extremely low loss of cryogenic liquid (helium, nitrogen), so that between two refilling periods there are very long times on the order of several months without helium refilling. In this way, disturbances of the system during the NMR measurements for the generation of high resolution spectra are avoided. The transient time after each filling of liquid helium into such a cryostat is generally several days up to about a week. In this way, a low loss cryostat contributes to a very high stability of the highly homogeneous magnetic field generated by the magnetic coil configuration, since no mechanical oscillations, no temperature gradients and no changes due to thermal tension occur during a measurement which would lead to a tilt of the magnet coil represented schematically in FIG. 1a and in this way would contribute to considerable field distortions. A vertical cylindrical room temperature bore 3 is provided for the purpose of inserting a measuring sample, not shown in the figure, and of a probehead into the homogeneity region of the NMR magnetic field generated by magnet coil 2.

The superconducting magnet coil 2 is housed inside the cryostat in an inner tank 4 and is surrounded by liquid helium. Between cylindrical outer hull 1 of the cryostat and the inner tank 4 on the one hand, and between inner tank 4 and room temperature bore 3 on the other hand, there are in both cases provided several radiation shields—not shown in the figure-, which can, for example, also be cooled by other cryogenic liquids, as e.g. by liquid nitrogen, and which are generally at a temperature above the liquid helium surrounding magnet coil 2.

The cryostat of FIG. 1a also comprises two towers 5, 5' on its top side arranged on a circular ring about axis r of the room temperature bore 3, through which liquid helium can be filled into the cryostat and/or evaporating helium can be guided to the outside. In the example shown, the vertical tower 5, 5' axes are in a vertical plane, which also contains the vertical room temperature bore 3 axis r. The superconducting magnet coil is symmetrically suspended in towers 5, 5'.

Figure 1B:
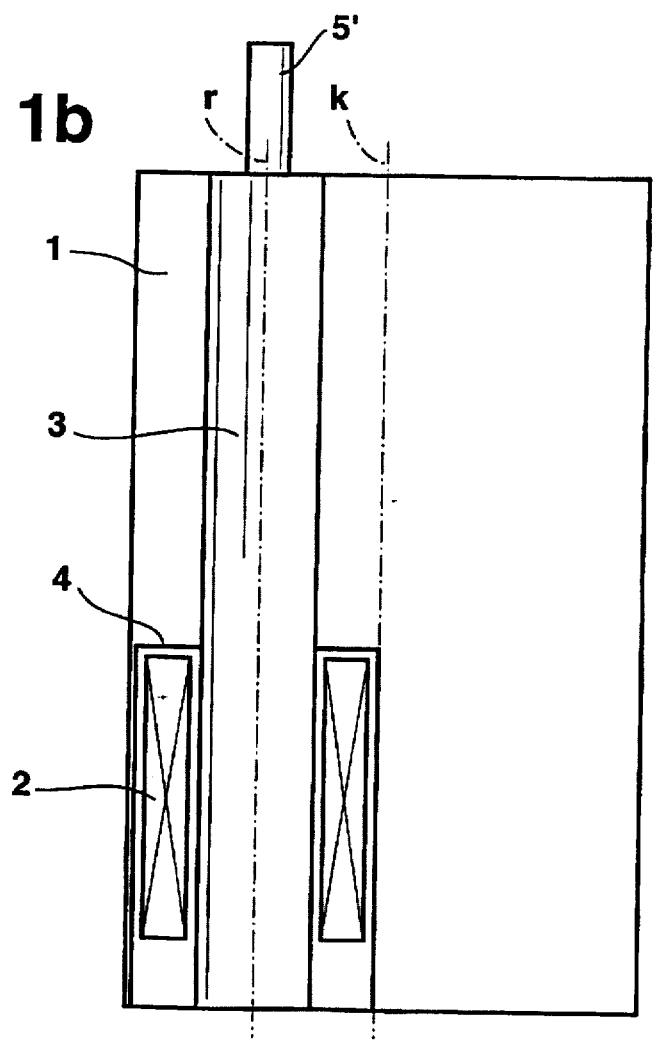

FIG. 1b shows a vertical cross section along the direction A—A according to FIG. 1a. This makes it clear that vertical axis r of the room temperature bore 3 runs parallel and at a distance to the vertical cylinder axis k of cylindrical cryostat container 1. By the eccentric arrangement of room temperature bore 3 in the cryostat, there is a considerably better side access to room temperature bore 3.

Figure 2A:
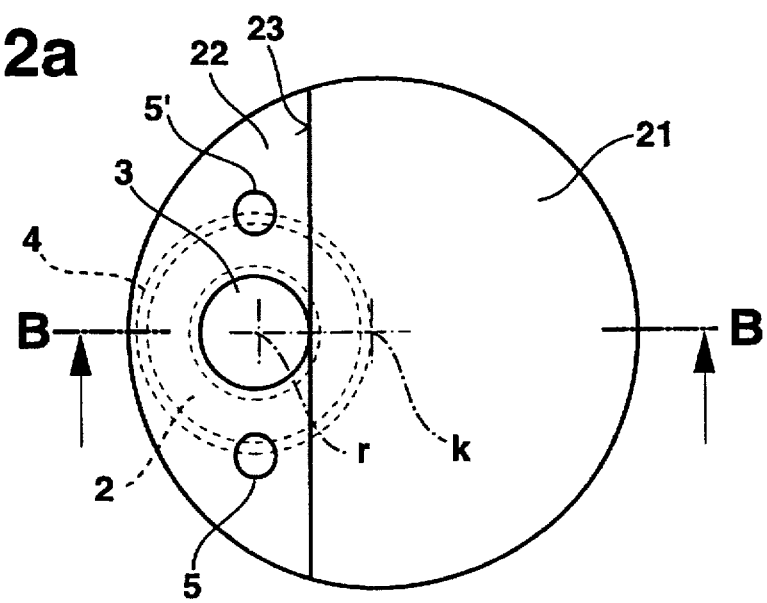
FIG. 2a a schematic horizontal cross-section across a magnet configuration according to the invention with a segment-shaped recess.
Figure 2B:
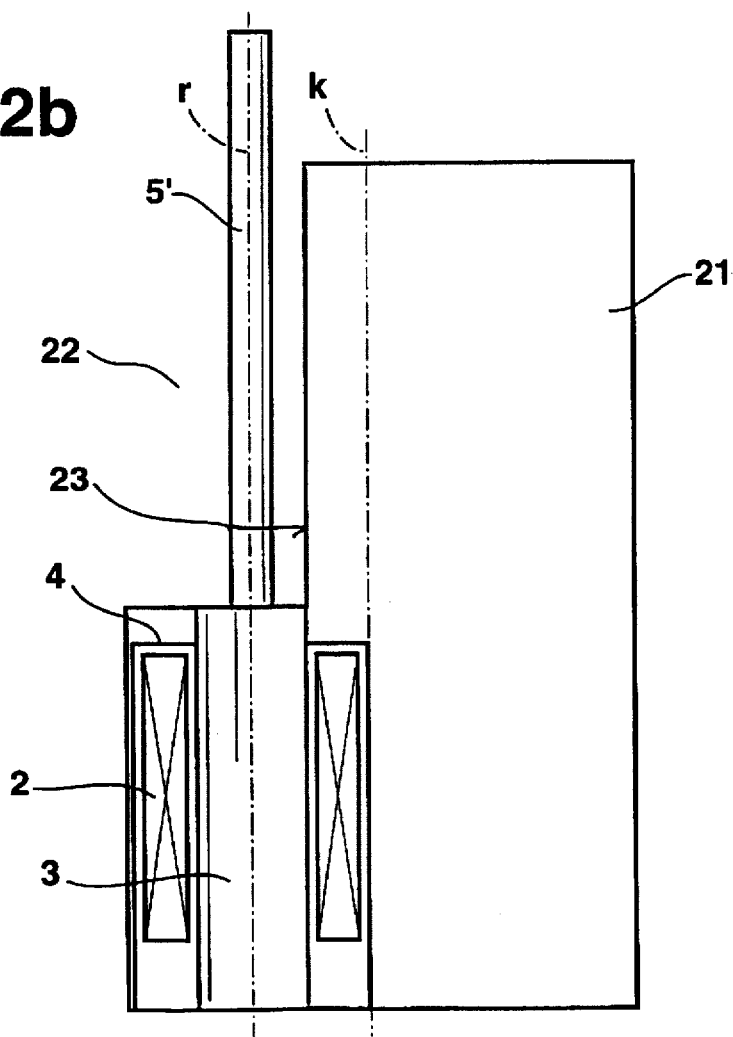

An additional improvement of the side access to the room temperature bore 3 can be achieved in the embodiments shown in FIGS. 2a and 2b by a cylindrical outer hull 21 comprising a recess in the region above magnet coil 2, running horizontally at least up to the, with respect to the container, inner edge of room temperature bore 3, and which extends vertically up to the upper end of the cryostat. In the embodiment shown in FIGS. 2a and 2b, recess 22 forms, in a horizontal cross-section, a segment with a straight horizontal edge 23, wherein the horizontal edge preferably just touches the, with respect to the container, inner edge of the room temperature bore 3. A recess would also be possible where the horizontal edge runs even further in the direction towards the container 21 centre, i.e. closer to vertical axis k.

Figure 3A:
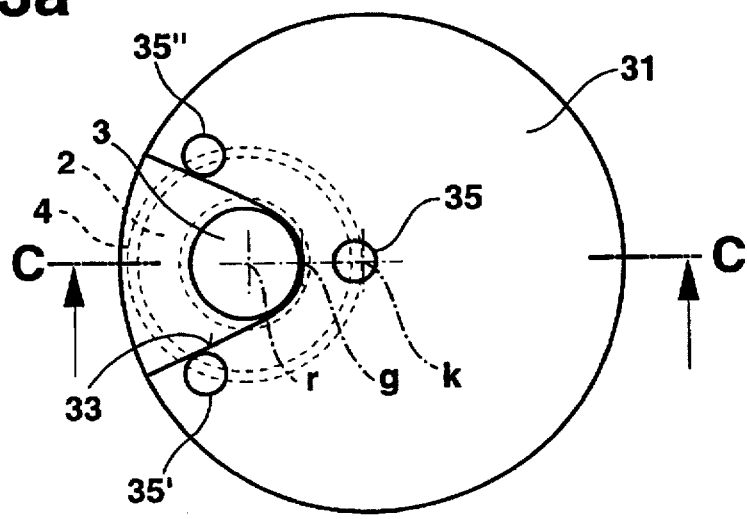
FIG. 3a a schematic horizontal cross-section across a magnet configuration according to the invention with a sector-shaped recess.
Figure 3B:
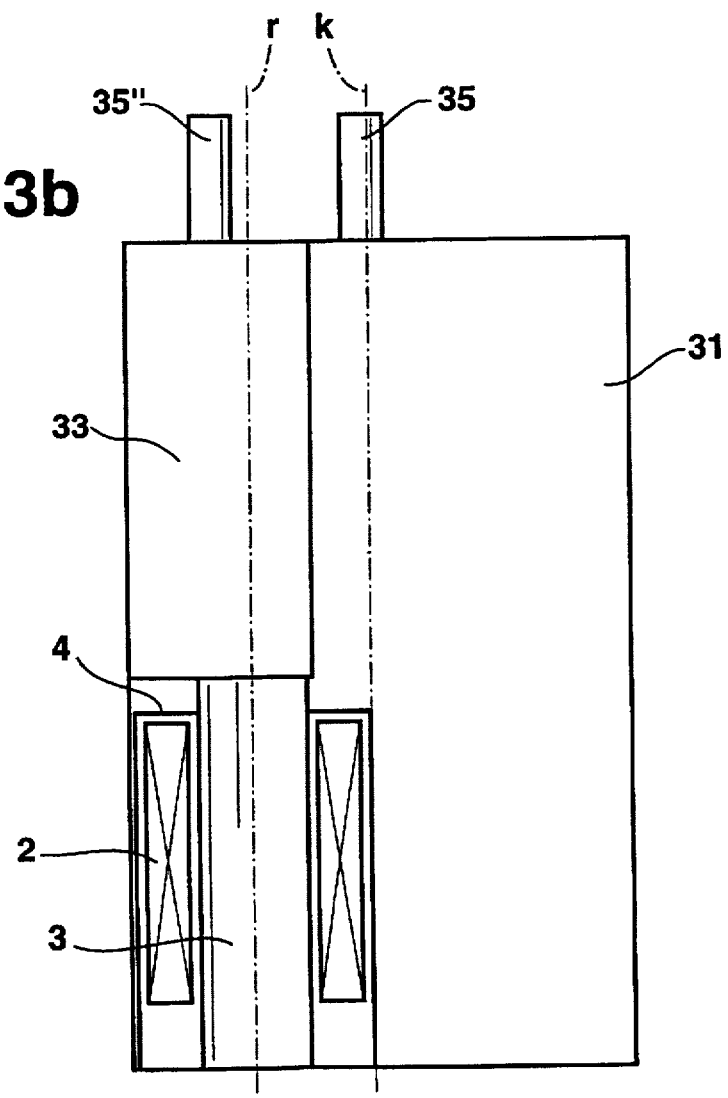

A further development of this embodiment is shown in FIGS. 3a and 3b, where a side recess 33 is provided which is sector-shaped in horizontal cross-section. Recess 33 runs in a predetermined angular range about an axis parallel to the room temperature bore 3 axis along a straight line g defining the, with respect to the container, inner edge of the room temperature bore 3. The solution shown in FIGS. 3a and 3b offers a side access to the room temperature bore 3 which is as good as the solution of FIGS. 2a and 2b, whereby the volume of recess 33 is minimised so that the cylindrical container 31 keeps an optimum remaining volume.

The helium filling, respectively evaporating towers 35, 35', 35", shown in FIGS. 3a and 3b, form an equilateral triangle with their vertical axes in the horizontal cross-section plane represented in FIG. 3a. An isosceles triangle is generally sufficient for a symmetrical suspension of magnet coil 2 in towers 35', 35".

One could also think of a variant of the magnet configuration according to the invention, not shown in detail in the figures, where recesses are provided as shown in FIGS. 2a through 3b, where, however, in contrast to the embodiments of the invention described above and below, the vertical axis r of the room temperature bore could coincide with the vertical axis k of the cylindrical cryostat container. In this case, too, the above described object of the invention would be achieved in providing for an improved side access to the room temperature bore. Although an eccentric arrangement of the magnet coil inside the cryostat substantially improves the side access, it also introduces constructional technical problems which would not occur with a concentric solution.

FIGS. 4a through 5b show embodiments of the magnet configuration according to the invention where the cryostat comprises two cylindrical containers, the first of which contains the magnet coil 2 and coaxially the room temperature bore 3, whereas the other container is at least partly arranged on top of the first container in such a way that both vertical cylinder axes r and k of the containers run parallel and at a distance, whereby cryogenic liquids of the same kind contained in both containers can be communicating. Such a configuration also decisively improves the side access to the room temperature bore 3 as can clearly be seen in FIGS. 4a through 5b.

Figure 4A:
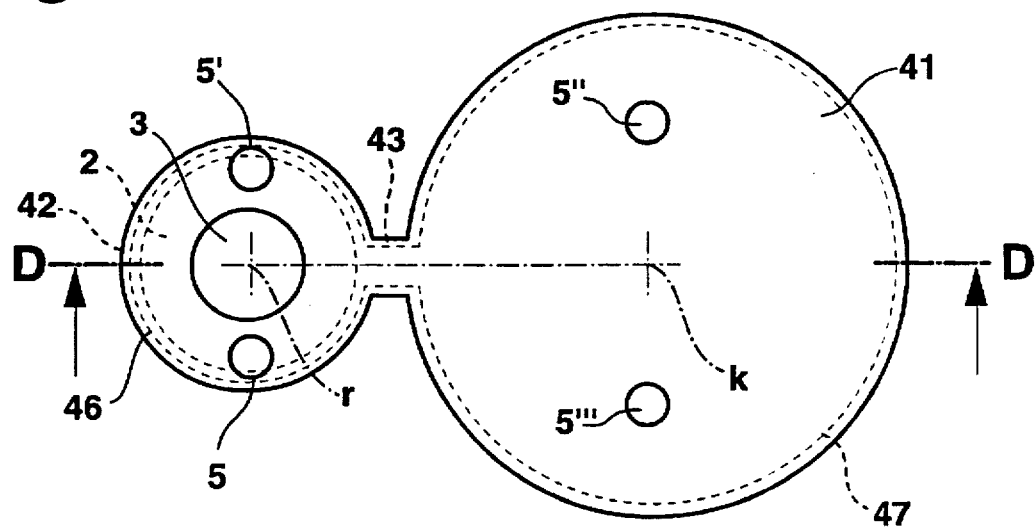
FIG. 4a a schematic horizontal cross-section across a magnet configuration according to the invention with two cylindrical containers arranged side by side.
Figure 4B:
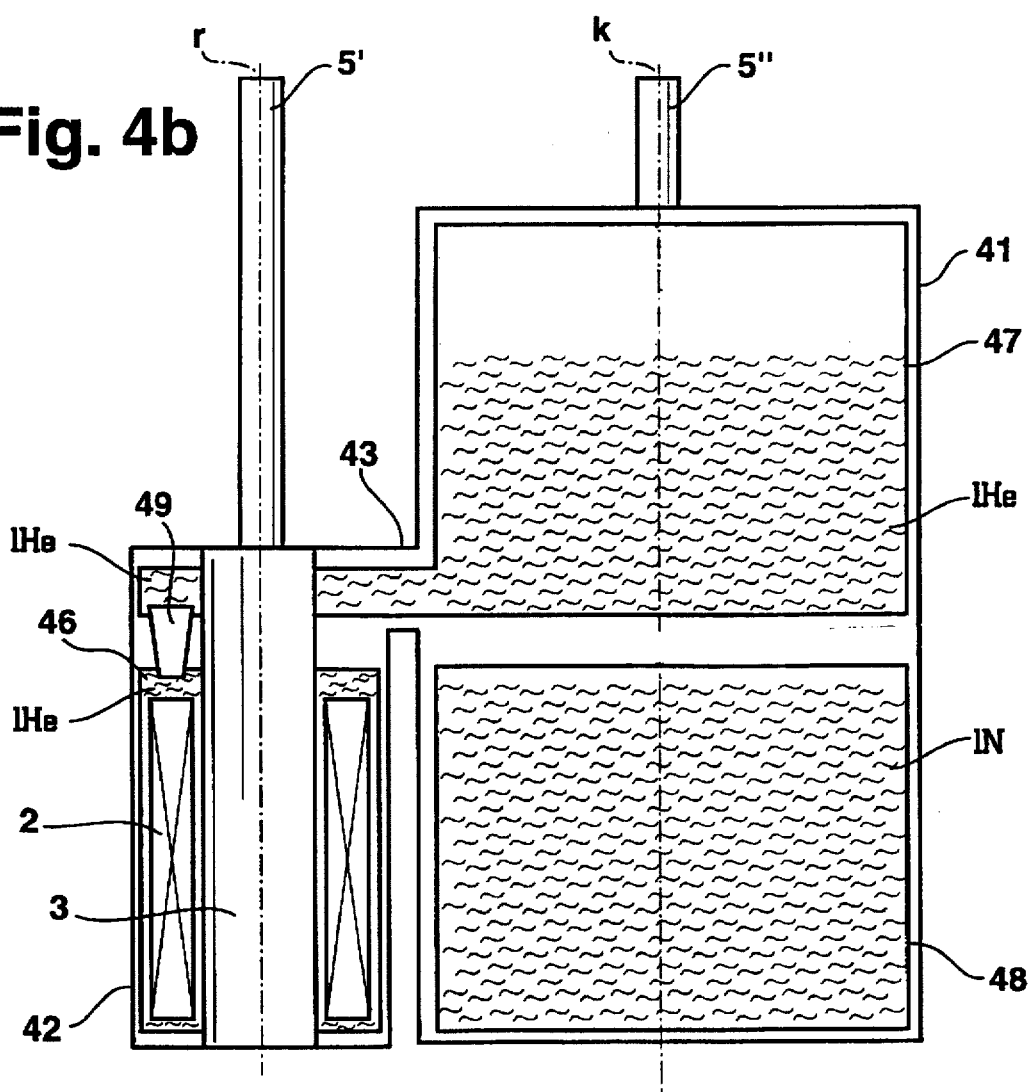

FIGS. 4a and 4b show a variant of this embodiment, where both containers 41, 42 are arranged side by side and comprise a horizontal connecting channel 43. Cryogenic liquid can flow via this channel from one container 41 to the other container 42. In particular, FIG. 4b shows a two-chamber system for liquid helium, where in a first chamber 46 the magnet coil 2 is located in supercooled liquid helium at a temperature of less than 4.2 K. In a further chamber 47 arranged above, there is liquid helium essentially at atmospheric pressure with a temperature of about 4.2 K, whereby the first chamber 46 is connected to the further chamber 47 via a conduit, not represented in detail, which can be closed by a stopper 49 or guided through it, in such a way that the supercooled liquid helium located in the first chamber 46 is also essentially at atmospheric pressure. The supercooling of the liquid helium in the first chamber 46 can for example be effected by a refrigerator which is not shown. Further chamber 47 is arranged above first chamber 46, so that the liquid helium can reach first chamber 46 from further chamber 47 without any pump. In this way, the fraction of supercooled liquid helium in chamber 46, which is lost by heat losses or by pumping, is continuously replaced by liquid helium flowing in from chamber 47. Stopper 49 also acts as a safety valve, in case for some reason the helium in chamber 46 should heat up and create an overpressure with respect to atmosphere. By the arrangement of both chambers 46 and 47 one above the other, a stable thermal and density-wise settling of the liquid helium is achieved.

Since the superconducting magnet configuration according to the invention shall serve to produce NMR spectra with very high resolution, particularly high field strengths and therefore particularly large magnet coils are required. This, in turn, leads to a particularly large space requirement and to an increased helium consumption compared to a "normal" cryostat. On the other hand, the present system is particularly sensitive in thermal equilibrium, whereas on the other hand the high field homogeneity required needs extraordinarily stable conditions. This particularly high stability cannot be achieved with a normal helium can and normal helium siphon for filling helium, as compared to the container 41 shown in FIG. 4a and FIG. 4b.

At this point, it shall again be emphasised that the representations of the figures presented are strongly schematic and do not show the many conventional details of a cryostat configuration. FIG. 4b schematically indicates a third chamber 48 arranged in the further cylindrical container 41 and containing liquid nitrogen (lN). However, the radiation shields usually arranged about the inner tanks of the cryostat, figuratively speaking, in the manner of onion skins are deliberately omitted in the figure for clarity purposes, but it goes without saying that they are present in the magnet configuration according to the invention. The tower constructions 5, 5', 5", 5"' shown in FIGS. 4a and 4b, too, are sketched only very schematically.

Figure 5A:
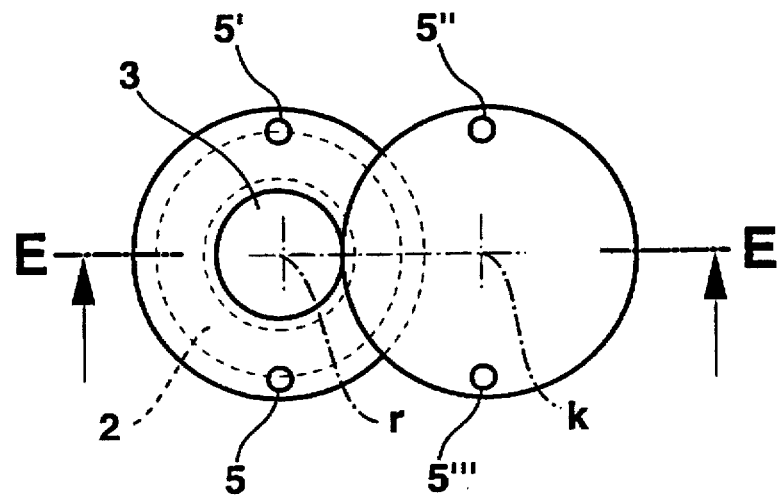
FIG. 5a a schematic horizontal cross-section across a magnet configuration according to the invention with two displaced cylindrical containers arranged on top of each other.
Figure 5B:
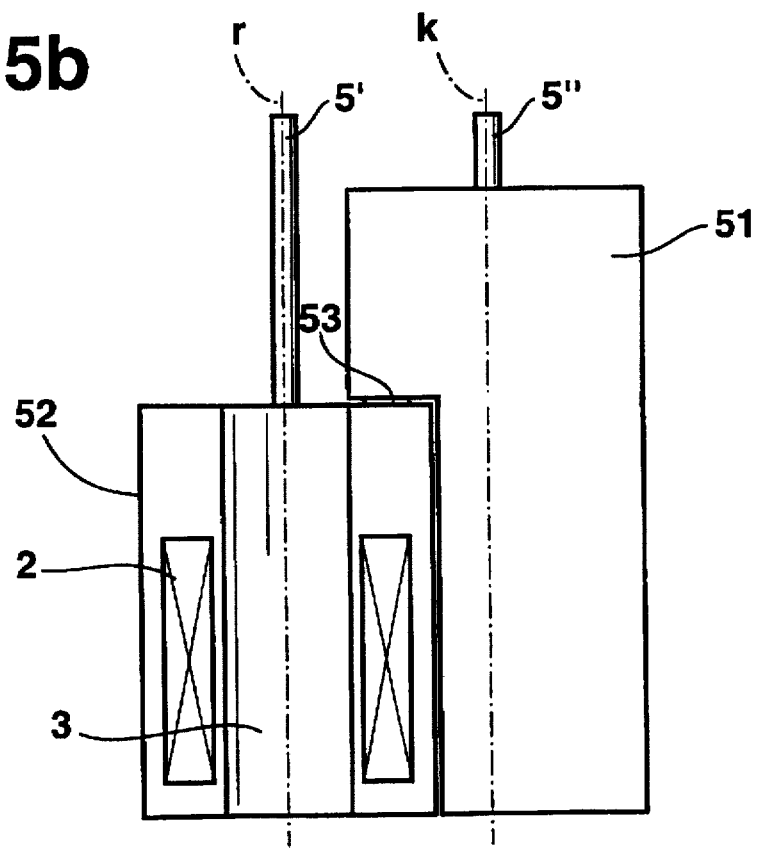

Finally, FIG. 5a and 5b show a further embodiment of a two-container configuration where both cylindrical containers 51, 52 are arranged, seen from the top, with their visible cross-sections overlapping and comprising a vertical connecting channel 53. Moreover, a chamber for liquid nitrogen may also be contained in the first cylindrical container 51. This compact embodiment may also comprise a two-chamber configuration for liquid helium at about 4.2 K and supercooled helium in the region of the magnet coil 2.

We claim:

1. A superconducting NMR spectrometer magnet configuration having a cryogenic liquid and comprising:

a low loss cryostat having a first container with cylindrical symmetry about a first container axis, said first container defining a vertical cylindrical room temperature bore having a vertical bore axis, said cryostat having an inner tank for the cryogenic liquid; and a superconducting NMR spectrometer magnet coil in thermal contact with the cryogenic liquid and enclosing said room temperature bore for generating a vertical, homogeneous and stable high strength magnetic field inside said bore, said magnet coil having a magnet axis substantially coincident with said bore axis, said magnet axis extending parallel to and at a separation from said first container axis.

2. The magnet configuration of claim 1, wherein said cryostat comprises a cylindrical outer hull having a top and a bottom, said bore extending from said top to said bottom.

3. The magnet configuration of claim 1, wherein said cryostat comprises a cylindrical outer hull having a recess above said magnet coil, said recess extending horizontally at least to an inner edge of said room temperature bore and extending vertically to an upper end of said cryostat.

4. The magnet configuration of claim 3, wherein said recess has a circular segment-shaped cross-section with a straight inner boundary, said straight boundary located between said inner edge and said container axis.

5. The magnet configuration of claim 3, wherein said recess has a circular segment-shaped cross-section with a curved inner boundary, said curved boundary extending from between said inner edge and said container axis to an outer surface of said container.

6. The magnet configuration of claim 1, wherein said cryostat comprises a second cylindrical container, coaxially surrounding said magnet coil and having a second container axis substantially coincident with said bore axis.

7. The magnet configuration of claim 6, wherein said first container extends over said second container to allow for communication of the cryogenic liquid between said first and said second containers.

8. The magnet configuration of claim 7, wherein said first and said second containers are arranged side by side and said cryostat further comprises a connecting section between said first and second containers.

9. The magnet configuration of claim 7, wherein said first container has a first circular cross-section and said second container has a second circular cross-section, said first and said second circular cross-sections overlapping another, said cryostat further comprising a vertical section connecting said first and second containers.

10. The magnet configuration of claim 1, wherein said inner tank comprises a first chamber which houses said magnet coil and which contains supercooled liquid helium at a temperature of less than 4.2 K, said inner tank further comprising a second chamber having liquid helium at a temperature of about 4.2 K substantially at atmospheric pressure, wherein said first and said second chambers are connected to keep said supercooled liquid helium substantially at atmospheric pressure.

11. The magnet configuration of claim 10, wherein said first chamber is arranged below said second chamber.

12. The magnet configuration of claim 1, wherein said magnet coil is symmetrically suspended inside said cryostat.

13. The magnet configuration of claim 1, wherein said cryostat further comprises a first tower having a first tower vertical axis and a second tower having a second tower vertical axis, said first and second towers located at a top side of said cryostat on a circular ring, said circular ring centered at said bore axis, said first and second towers for filling said cryostat with liquid helium and for guiding evaporating helium out of said cryostat.

14. The magnet configuration of claim 13, wherein said first tower axis, said second tower axis, and said bore axis are coplanar.

15. The magnet configuration of claim 13, wherein said cryostat further comprises a third tower located at said top side of said cryostat on said circular ring, said third tower having a third tower axis, said first, second, and third tower axes forming, in a horizontal cross-section plane, an isosceles triangle.

* * * * *